(12) United States Patent
Liu

(10) Patent No.: US 11,316,129 B2
(45) Date of Patent: Apr. 26, 2022

(54) DISPLAY PANEL WITH PACKAGING LAYER IN A NOTCH OF NON-DISPLAY AREA AND MANUFACTURING METHOD THEREOF

(71) Applicant: SHENZHEN CHINA STAR OPTOELECTRONICS SEMICONDUCTOR DISPLAY TECHNOLOGY CO., LTD., Shenzhen (CN)

(72) Inventor: Xiaowei Liu, Shenzhen (CN)

( * ) Notice: Subject to any disclaimer, the term of this patent is extended or adjusted under 35 U.S.C. 154(b) by 298 days.

(21) Appl. No.: 16/618,367

(22) PCT Filed: Aug. 7, 2019

(86) PCT No.: PCT/CN2019/099560
§ 371 (c)(1),
(2) Date: Dec. 1, 2019

(87) PCT Pub. No.: WO2021/000375
PCT Pub. Date: Jan. 7, 2021

(65) Prior Publication Data
US 2021/0359263 A1 Nov. 18, 2021

(30) Foreign Application Priority Data
Jul. 3, 2019 (CN) .......................... 201910595793.9

(51) Int. Cl.
*H01L 51/52* (2006.01)
*H01L 27/32* (2006.01)
*H01L 51/56* (2006.01)

(52) U.S. Cl.
CPC ........ *H01L 51/5253* (2013.01); *H01L 27/322* (2013.01); *H01L 27/3244* (2013.01); *H01L 51/56* (2013.01); *H01L 2227/323* (2013.01)

(58) Field of Classification Search
None
See application file for complete search history.

(56) References Cited

U.S. PATENT DOCUMENTS

| 6,103,541 | A | * | 8/2000 | Yang | H01L 51/5243 29/608 |
| 2015/0207100 | A1 | * | 7/2015 | Saito | H01L 51/5237 257/40 |
| 2016/0064418 | A1 | | 3/2016 | Shi | |
| 2019/0181205 | A1 | | 6/2019 | Kim | |
| 2019/0237703 | A1 | * | 8/2019 | Kim | H01L 51/5012 |

FOREIGN PATENT DOCUMENTS

| CN | 102956649 A | | 3/2013 |
| CN | 203643711 U | | 6/2014 |
| CN | 109728042 A | * | 5/2019 |
| CN | 109728042 A | | 5/2019 |
| CN | 109950196 A | | 6/2019 |
| CN | 109950277 A | | 6/2019 |

* cited by examiner

*Primary Examiner* — Nduka E Ojeh

(57) ABSTRACT

The present invention provides a display panel and a manufacturing method thereof. The display panel includes a display area, a non-display area surrounding the display area, and an array substrate disposed in the display area and the non-display area; the array substrate includes a notch disposed in the non-display area of the array substrate and surrounding the display area to form a circle; and a packaging layer filled in the notch, and a material of the packaging layer is silicon nitride.

10 Claims, 2 Drawing Sheets

DISPLAY PANEL WITH PACKAGING LAYER IN A NOTCH OF NON-DISPLAY AREA AND MANUFACTURING METHOD THEREOF

FIELD OF INVENTION

The present invention relates to the field of display technologies, and specifically to a display panel and a manufacturing method thereof.

BACKGROUND OF INVENTION

With advantages of low power consumption and narrow border, the market share of oxide thin film transistor (TFT) panels is getting higher. However, oxide TFTs are very sensitive to water vapor and hydrogen ions in the air. Water vapor and free hydrogen ions deprive oxide semiconductors of oxygen to conductorize semiconductors, making TFTs lose switching function, thereby causing poor display.

There are two primary solutions in current industry. One is using SiNx as an insulating layer for TFT. SiNx has better insulation, and its membrane is dense that it has exceptional abilities to block water vapor and free ions such as Na and K. However, there are many free H+ in SiNx, and they easily diffuse to TFTs devices causing TFT devices to malfunction and the yield rate to drop. Besides, using SiNx as passivation layer for via-hole etching, it is easy to form undercuts and etching by-products when SiNx and SiOx are etched at the same time because the etching characteristics of SiNx and SiOx are quite different. Its process window is small, and it is needed to add an insulating layer, thereby affecting productivity and yield rate severely. The second solution is using SiNO or SiOx as an insulating layer for TFT devices. However, SiNO and SiOx membranes are porous and hydrophilic that their abilities to block water vapor and free ions such as Na and K are poor. Water vapor gets into the panel easily, especially from the surroundings of the panel, thereby causing the surroundings of the panel to display poorly.

To solve above problems, the present invention provides a display panel and a manufacturing method thereof, to solve the problem of many free hydrogen ions in silicon nitride easily diffusing to electronic devices causing the devices to malfunctions and silicon oxide cannot block water and oxygen effectively in prior art.

SUMMARY OF INVENTION

The solution to solve above problems is: the present invention providing a display panel, comprising a display area, a non-display area surrounding the display area, and an array substrate disposed in the display area and the non-display area; wherein the array substrate comprises:

a notch disposed in the non-display area of the array substrate and surrounding the display area to form a circle; and a packaging layer filled in the notch, and a material of the packaging layer is silicon nitride.

Further, the array substrate further comprises:
a substrate;
a gate layer disposed on the substrate;
a first insulating layer disposed on the substrate and covering the gate layer;
a second insulating layer disposed on the first insulating layer;
a first metal layer disposed on the second insulating layer;
a source and drain electrode disposed on the second insulating layer and electrically connected to the first metal layer;
a first encapsulation layer disposed on the second insulating layer and covering the source and drain electrode and the first metal layer;
a second encapsulation layer disposed on the first encapsulation layer;
a light-emitting layer disposed on the second encapsulation layer and electrically connected to the source and drain electrode through the first encapsulation layer and the second encapsulation layer; wherein the notch penetrates through the second encapsulation layer and the first insulating layer.

Further, the array substrate further comprises
a second metal layer disposed on the substrate and having a height the same as the gate layer; wherein the second metal layer corresponds to the notch.

Further, a material of the first insulating layer is silicon nitride; a material of the second insulating layer is silicon oxide.

Further, a material of the first encapsulation layer is silicon oxide;
a material of the second encapsulation layer is silicon oxynitride.

Further, further comprising: a color filter substrate disposed opposite to the array substrate;
a sealing structure sealed between the color filter substrate and the array substrate, and corresponding to the notch.

The present invention further provides a manufacturing method of a display panel ' comprising:
providing an array substrate, the array substrate comprising a display area and a non-display area;
making a notch in the non-display area of the array substrate, wherein the notch surrounds the display area to form a circle;
coating a photoresist on an opening side of the notch of the array substrate to form a photoresist layer;
coating a layer of silicon nitride on the photoresist layer, wherein the silicon nitride fills the notch;
developing to remove the photoresist layer and silicon nitride on the photoresist layer; wherein the remaining silicon nitride in the notch forms a packaging layer.

Further, manufacturing steps of the array substrate comprises:
S1) providing a substrate;
S2) forming a gate layer on the substrate, wherein the gate layer is disposed in the display area; forming a second metal layer in the non-display area of the substrate, wherein the second metal layer having a same height as the gate layer;
S3) depositing a first insulating layer on the gate layer, wherein the first insulating layer covers the gate layer and the second metal layer;
S4) forming a second insulating layer on the first insulating layer;
S5) forming a first metal layer on the second insulating layer, and the first metal layer is corresponding to the gate layer;
S6) forming a source and drain electrode on the second insulating layer, the source and drain electrode dispersed on both sides of the first metal layer and electrically connected to the first metal layer;
S7) forming a first encapsulation layer on the second insulating layer, and the first encapsulation layer covering the source and drain electrode and the first metal layer.

Further, the temperature is less than 200° C. during the silicon nitride coating process.

Further, the manufacturing method of a display panel further comprises:
providing a color filter substrate;

forming a sealing structure corresponding to the notch, wherein the sealing structure is sealingly connected to the color filter substrate and the array substrate.

A display panel and a manufacturing method thereof of the present invention can effectively block water and oxygen getting into the display panel from the surroundings by making a notch on the array substrate corresponding to the sealing structure and filling silicon nitride into the notch. And the notch is disposed in the non-display area of the display panel, so the free hydrogen ions in silicon nitride cannot diffuse to the source and drain electrode, thereby not causing the display panel to malfunctions and effectively preventing poor display.

DESCRIPTION OF DRAWINGS

The accompanying figures to be used in the description of embodiments of the present disclosure will be described in brief to more clearly illustrate the technical solutions of the embodiments. The accompanying figures described below are only part of the embodiments of the present disclosure, from which figures those skilled in the art can derive further figures without making any inventive efforts.

DETAILED DESCRIPTION OF PREFERRED EMBODIMENTS

Figure 1:
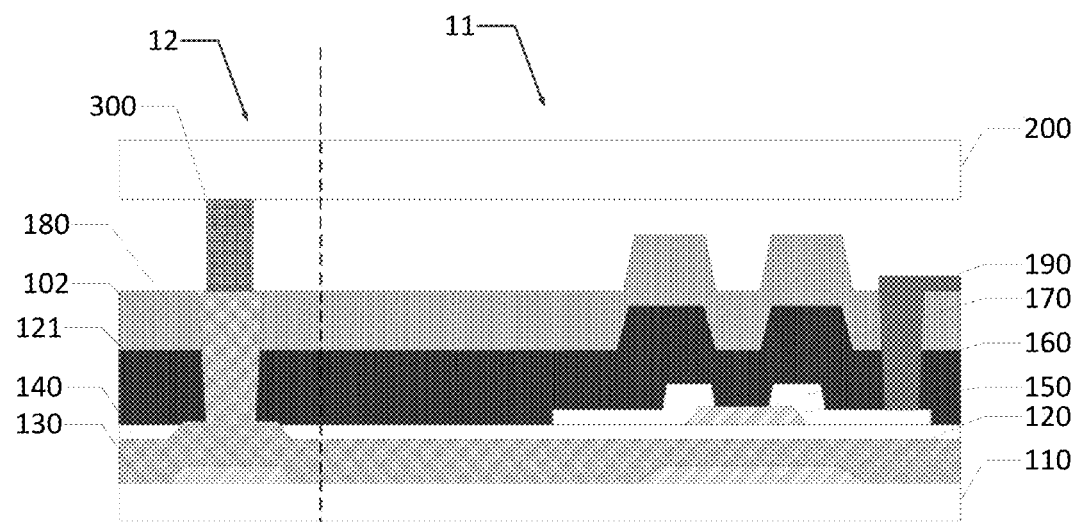
FIG. 1 is a schematic diagram of a display panel according to one embodiment.

The embodiments of the present disclosure are described in detail hereinafter. Examples of the described embodiments are given in the accompanying drawings. n the description of the present disclosure, it should be understood that terms such as "upper," "lower," "front," "rear," "left," "right," "top," "bottom," as well as derivative thereof should be construed to refer to the orientation as then described or as shown in the drawings under discussion. These relative terms are for convenience of description, do not require that the present disclosure be constructed or operated in an particular orientation, and shall not be construed as causing limitations to the present disclosure.

Embodiment

As shown in FIG. 1, the display panel 10 in the present invention comprises an array substrate 100 and a color filter substrate 200 disposed opposite to the array substrate 100.

The display panel 10 is provided with a display area 11 and a non-display area 12 surrounding the display area 11. Wherein the array substrate 100 comprises a substrate 110, a gate layer 120, a first insulating layer 130, a second insulating layer 140, a first metal layer 150, a source and drain electrode 160, a first encapsulation layer 170, a second encapsulation layer 180 and a light-emitting layer 190.

The substrate 110 is a hard glass substrate. The gate layer 120 is disposed on the substrate 110.

The first insulating layer 130 is disposed on the substrate 110 and covers the gate layer 120 for insulating the gate layer 120. The material of the first insulating layer 130 is silicon nitride; silicon nitride has better insulation, and its membrane is dense that it has exceptional abilities to block water vapor and free ions such as Na and K.

However, there are many free H⁺ in silicon nitride, and they easily diffuse to the display panel 10 causing the display panel 10 to malfunction and the yield rate to drop; so in the embodiment, the second insulating layer 140 is disposed on the first insulating layer 130, and the second insulating layer 140 is silicon oxide to prevent water vapor intrusion.

The first metal layer 150 is disposed on the second insulating layer 140, wherein the first metal layer 150 is in the display area 11 of the display panel 10.

The source and drain electrode 160 is disposed on both sides of the first metal layer 150 and electrically connected to the first metal layer 150.

The first encapsulation layer 170 is disposed on the second insulating layer 140 and covers the first metal layer 150 and the source and drain electrode 160, wherein the material of the first encapsulation layer 170 is silicon oxide, which prevents water vapor intrusion that causes the display panel 10 to malfunction.

The second encapsulation layer 180 is disposed on the first encapsulation layer 170, the material of the second encapsulation layer 180 is silicon oxynitride, which further prevents water and oxygen intrusion and protects the first metal layer 150 and the source and drain electrode 160.

The light-emitting layer 190 is disposed on the second encapsulation layer 180 and penetrates through the first encapsulation layer 170 and the second encapsulation layer 180 to be electrically connected to the source and drain electrode 160.

Because membranes of silicon oxide and silicon oxynitride are porous and hydrophilic that their abilities to block water vapor and free ions such as Na and K are poor. Especially, water vapor easily gets into the display panel 10 from the surroundings of the display panel 10, and thereby causing the surroundings of the display panel 10 to display poorly.

Figure 2:
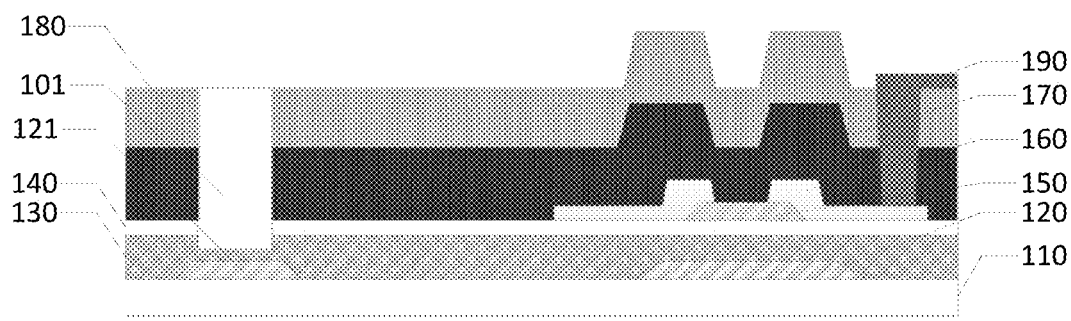
FIG. 2 is a partial schematic diagram of a display panel according to one embodiment.

As shown in FIG. 2, to prevent this situation, in the embodiment of the present invention, the non-display area 12 in the display panel 10 is provided with a notch 101, specifically, the notch 101 is disposed on the array substrate 100, penetrating through from the second encapsulation layer 180 to the first insulating layer 130. The notch 101 is disposed in the non-display area 12 and surrounds the display area 11 to form a circle.

The notch 101 has a wider top and a narrower bottom, similar to an inverted trapezoid, and is used to fill a packaging layer 102. One end of the packaging layer 102 is connected to the first insulating layer 130, and the other end of the packaging layer 102 is at the same level with one side of the second encapsulation layer 180 away from the first encapsulation layer 170. The material of the packaging layer 102 is the same as the material of the first insulating layer 130, both of which are silicon nitride. Silicon nitride has better insulation, and its membrane is dense that it has exceptional abilities to block water vapor and free ions such as Na and K. Because the packaging layer 102 is only disposed in the notch 101, it can not only prevent water vapor intrusion caused by using silicon oxide and silicon oxynitride as materials of the first encapsulation layer 170 and the second encapsulation layer 180 in the surroundings of the display panel 10, but also can prevent damages to the first metal layer 150 and the source and drain electrode 160 caused by free hydrogen ions when using silicon nitride.

To reduce the depth of the packaging layer 102 in the notch 101 and to improve uniformity, in this embodiment, a second metal layer 121 is disposed on the substrate 110, and the material and the height of the second metal layer 121 is the same as the gate layer 120. The difference is that the second metal layer 121 is disposed in the non-display area of the array substrate 100 corresponding to the notch 101.

In this embodiment, the display panel 10 further comprises a sealing structure 300, and the sealing structure 300 is connected to the array substrate 100 and the color filter substrate 200. Specifically, the sealing structure 300 is disposed in the non-display area 12 of the display panel 10 corresponding to the notch 101 and is used to seal the display panel.

For better explaining the present invention, the embodiment provides a manufacturing method of the display panel 10, wherein the manufacturing steps of the array substrate comprises S1) to S7).

Figure 3:
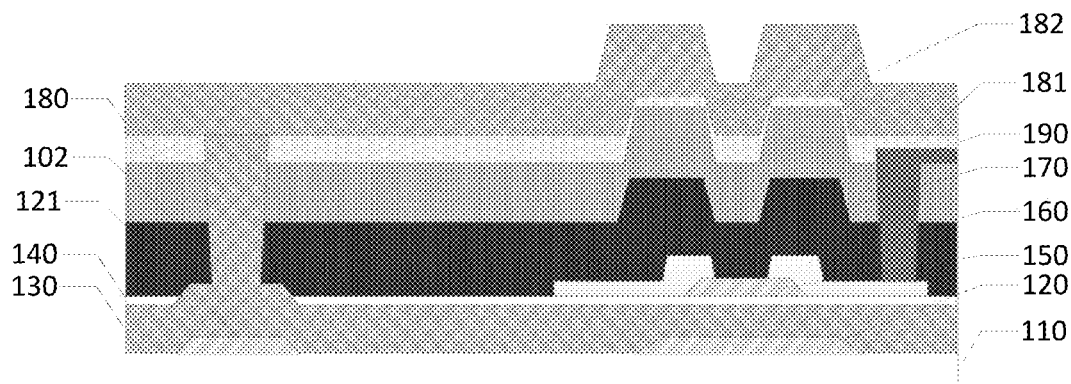
FIG. 3 is a schematic diagram of a manufacturing method of a display panel according to one embodiment.

S1) providing a substrate;

S2) forming a gate layer 120 on the substrate 110, and the gate layer 120 disposed in the display area 11; forming a second metal layer 121 in the non-display area 12 of the substrate 110, and the second metal layer 121 having a same height as the gate layer 120;

S3) depositing a first insulating layer 130 on the gate layer 120, wherein the first insulating layer 130 covers the gate layer 120 and the second metal layer 121;

S4) forming a second insulating layer 140 on the first insulating layer 130;

S5) forming a first metal layer 150 on the second insulating layer 140, wherein the first metal layer 150 corresponds to the gate layer 120;

S6) forming a source and drain electrode 160 on the second insulating layer 140, wherein the source and drain electrode 160 is dispersed on both sides of the first metal layer 150 and electrically connected to the first metal layer 150;

S7) forming a first encapsulation layer 170 on the second insulating layer 140, wherein the first encapsulation layer 170 covers the source and drain electrode 160 and the first metal layer 150;

S8) forming a second encapsulation layer 180 on the first encapsulation layer 170;

S9) making a notch in the non-display area of the array substrate, specifically, making a notch 101 on the second encapsulation layer 180. The notch 101 penetrates through from the second encapsulation layer 180 to the first insulating layer 130;

S10) as shown in FIG. 3, coating a photoresist on the second encapsulation layer 180 of the array substrate 100;

Exposing and developing the photoresist on the notch 101, while the remaining photoresist forms a photoresist layer 181;

S11) coating silicon nitride to form a silicon nitride layer 182 on the photoresist layer 181, and due to removal of the photoresist on the notch 101, the silicon nitride enters the interior of the notch 101 and fills the notch 101 through the upper opening of the notch 101; to prevent evaporation of the photoresist during the process of coating silicon nitride, the temperature needs to be maintained under 200° C.

Figure 4:
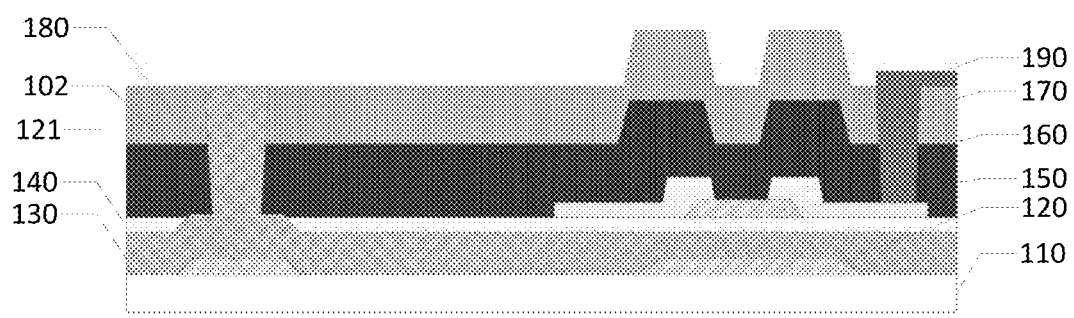
FIG. 4 is a schematic diagram of an array substrate according to one embodiment.

As shown in FIG. 4, develop the photoresist layer 181 and the silicon nitride layer 182 on the photoresist layer 181. Since silicon nitride on the photoresist layer 181 will automatically fall off with the underlying photoresist 181 during development, it can prevent damages to the second encapsulation layer 180 caused by removal of the silicon nitride layer 182 through etching. Remaining silicon nitride in the notch 101 forms a packaging layer 102.

The present disclosure has been described with a preferred embodiment thereof. The preferred embodiment is not intended to limit the present disclosure, and it is understood that many changes and modifications to the described embodiment can be carried out without departing from the scope and the spirit of the disclosure that is intended to be limited only by the appended claims.

What is claimed is:

1. A display panel, comprising a display area, a non-display area surrounding the display area, and an array substrate disposed in the display area and the non-display area;
   wherein the array substrate comprises:
   a substrate;
   a gate layer disposed on the substrate;
   a first insulating layer disposed on the substrate and covering the gate layer;
   a second insulating layer disposed on the first insulating layer;
   a first metal layer disposed on the second insulating layer;
   a source and drain electrode disposed on the second insulating layer and electrically connected to the first metal layer;
   a first encapsulation layer disposed on the second insulating layer and covering the source and drain electrode and the first metal layer;
   a second encapsulation layer disposed on the first encapsulation layer;
   a notch defined in the non-display area of the array substrate, surrounding the display area to form a circle, and penetrating from the second encapsulation layer to the first insulating layer; and
   a packaging layer filled in the notch, wherein a material of the packaging layer is silicon nitride.

2. The display panel according to claim 1, wherein the array substrate further comprises:
   a light-emitting layer disposed on the second encapsulation layer and electrically connected to the source and drain electrode through the first encapsulation layer and the second encapsulation layer.

3. The display panel according to claim 1, further comprising
   a second metal layer disposed on the substrate and having a same height as the gate layer; wherein the second metal layer corresponds to the notch.

4. The display panel according to claim 1, wherein
   a material of the first insulating layer is silicon nitride;
   a material of the second insulating layer is silicon oxide.

5. The display panel according to claim 1, wherein
   a material of the first encapsulation layer is silicon oxide;
   a material of the second encapsulation layer is silicon oxynitride.

6. The display panel according to claim 1, further comprising:
   a color filter substrate disposed opposite to the array substrate;
   a sealing structure sealed between the color filter substrate and the array substrate, and corresponding to the notch.

7. A manufacturing method of a display panel, comprising following steps:
   providing an array substrate comprising a display area and a non-display area surrounding the display area;
   wherein manufacturing steps of the array substrate comprises:
   S1) providing a substrate;
   S2) forming a gate layer on the substrate, wherein the gate layer is disposed in the display area;
   S3) depositing a first insulating layer on the gate layer, wherein the first insulating layer covers the gate layer;

S4) forming a second insulating layer on the first insulating layer;

S5) forming a first metal layer on the second insulating layer, wherein the first metal layer corresponds to the gate layer;

S6) forming a source and drain electrode on the second insulating layer, wherein the source and drain electrode is disposed on both sides of the first metal layer and electrically connected to the first metal layer;

S7) forming a first encapsulation layer on the second insulating layer, and the first encapsulation layer covering the source and drain electrode and the first metal layer; and S8) forming a second encapsulation layer on the first encapsulation layer;

making a notch on the second encapsulation layer in the non-display area of the array substrate, wherein the notch surrounds the display area to form a circle and penetrates from the second encapsulation layer to the first insulating layer;

coating a photoresist on an opening side of the notch of the array substrate to form a photoresist layer;

coating a layer of silicon nitride on the photoresist layer, wherein the silicon nitride fills the notch; and developing to remove the photoresist layer and the layer of silicon nitride on the photoresist layer; wherein remaining silicon nitride in the notch forms a packaging layer.

8. The manufacturing method of the display panel according to claim 7, wherein the step S2 further comprises following steps:

forming a second metal layer in the non-display area of the substrate, wherein the second metal layer has a same height as the gate layer.

9. The manufacturing method of the display panel according to claim 7, wherein a temperature is less than 200° C. during a silicon nitride coating process.

10. The manufacturing method of the display panel according to claim 7, further comprising:

providing a color filter substrate;

forming a sealing structure corresponding to the notch, wherein the sealing structure is sealingly connected to the color filter substrate and the array substrate.

\* \* \* \* \*